(12) United States Patent
Reshetnyak

(10) Patent No.: US 10,228,198 B2
(45) Date of Patent: Mar. 12, 2019

(54) MULTI-DISK HEAT EXCHANGER AND FAN UNIT

(71) Applicant: Aleksandr Reshetnyak, Miami, FL (US)

(72) Inventor: Aleksandr Reshetnyak, Miami, FL (US)

( * ) Notice: Subject to any disclaimer, the term of this patent is extended or adjusted under 35 U.S.C. 154(b) by 188 days.

(21) Appl. No.: 15/283,826

(22) Filed: Oct. 3, 2016

(65) Prior Publication Data

US 2018/0094869 A1 Apr. 5, 2018

(51) Int. Cl.

| | |
|---|---|
| *F28D 7/16* | (2006.01) |
| *F28F 13/12* | (2006.01) |
| *F28F 3/02* | (2006.01) |
| *F28F 9/00* | (2006.01) |
| *F24F 1/0022* | (2019.01) |
| *F28D 1/04* | (2006.01) |
| *F28F 1/24* | (2006.01) |
| *H01L 23/467* | (2006.01) |
| *F28D 1/02* | (2006.01) |
| *F28D 21/00* | (2006.01) |
| *F24F 1/0025* | (2019.01) |
| *F04D 17/16* | (2006.01) |
| *F04D 29/28* | (2006.01) |

(52) U.S. Cl.
CPC ............ *F28F 13/12* (2013.01); *F24F 1/0022* (2013.01); *F28D 1/024* (2013.01); *F28D 1/04* (2013.01); *F28F 1/24* (2013.01); *F28F 3/02* (2013.01); *F28F 9/001* (2013.01); *H01L 23/467* (2013.01); *F04D 17/161* (2013.01); *F04D 29/281* (2013.01); *F24F 1/0025* (2013.01); *F28D 2021/0031* (2013.01); *F28D 2021/0068* (2013.01); *F28D 2021/0071* (2013.01); *F28F 2250/08* (2013.01); *F28F 2250/102* (2013.01)

(58) Field of Classification Search
CPC .............................. F28F 13/12; F04D 17/161
USPC .................................................. 165/120, 122
See application file for complete search history.

(56) References Cited

U.S. PATENT DOCUMENTS

| | | | |
|---|---|---|---|
| 5,394,040 A * | 2/1995 | Khanh ................... | F04D 17/161 310/54 |
| 2011/0268430 A1* | 11/2011 | Waldner ............... | F02M 27/045 392/379 |
| 2016/0069219 A1* | 3/2016 | Shaffer ................... | F01K 11/04 60/670 |

* cited by examiner

*Primary Examiner* — Jianying Atkisson
*Assistant Examiner* — Joel Attey
(74) *Attorney, Agent, or Firm* — Nadya Reingand; Yan Hankin

(57) ABSTRACT

Disclosed herein are devices, methods, and systems for heat exchange, comprising one or more multi-disk rotors, one or more finned thermal elements, and a cover, which, even without an external fan, are combined in one apparatus to form a directed movement of fluid and heat exchange. Additional embodiments comprise an additional circulation chamber, integrated with/within said apparatus and/or external fans and/or at least one baffle in a circulation chamber for further directing and intensifying a changing of temperature of fluid passing through the apparatus. A highly efficient heat exchange is achieved by a high temperature gradient near the heat transferring surface and by a high-volume pumping capability of the multi-disk fan. The devices, methods, and systems are particularly applicable in fields that require compactness and low noise levels during operation, such as air conditioning and CPU cooling.

17 Claims, 14 Drawing Sheets

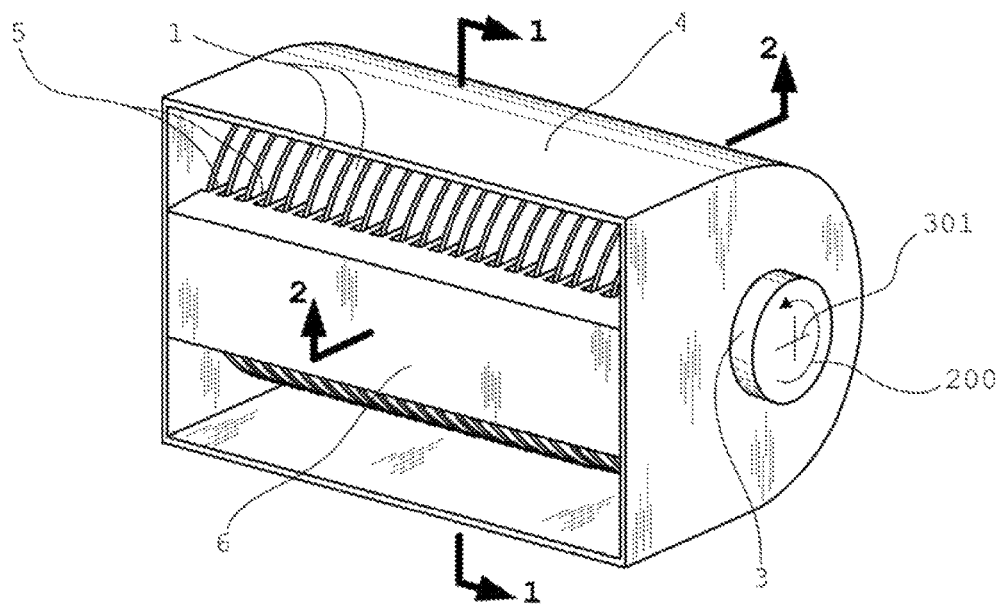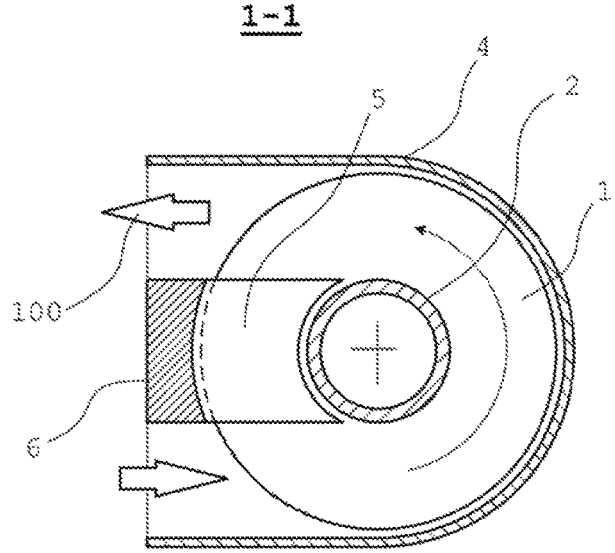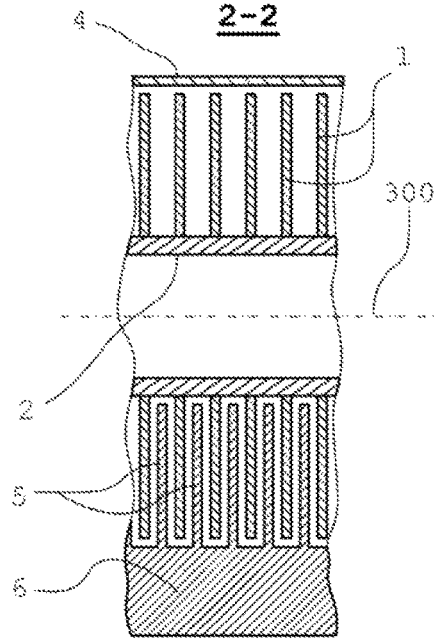

Fig. 10
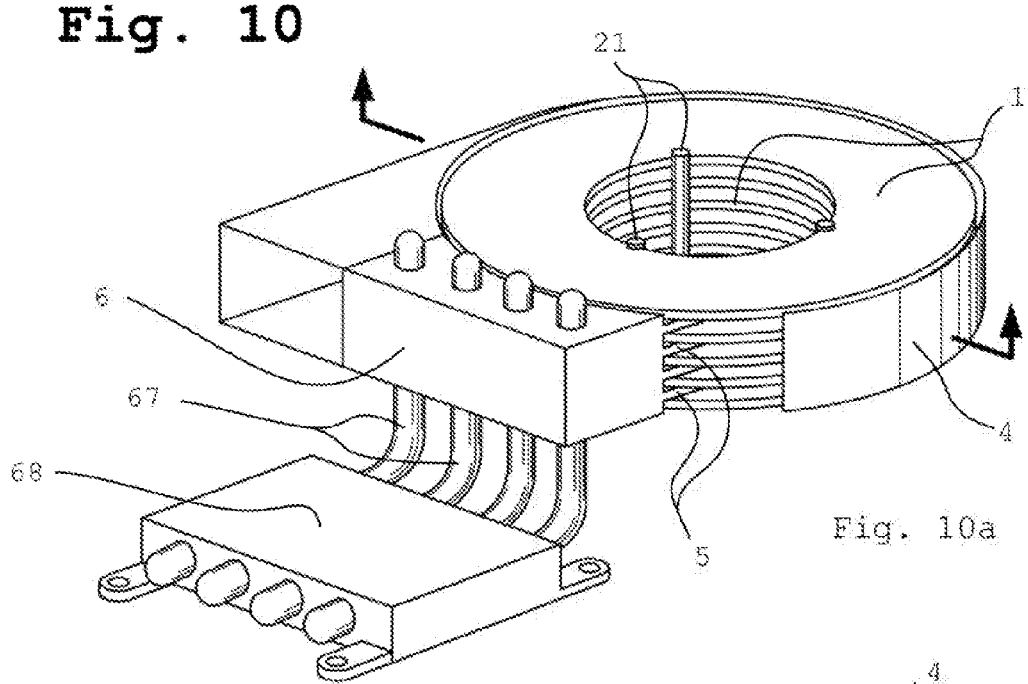
Fig. 10a
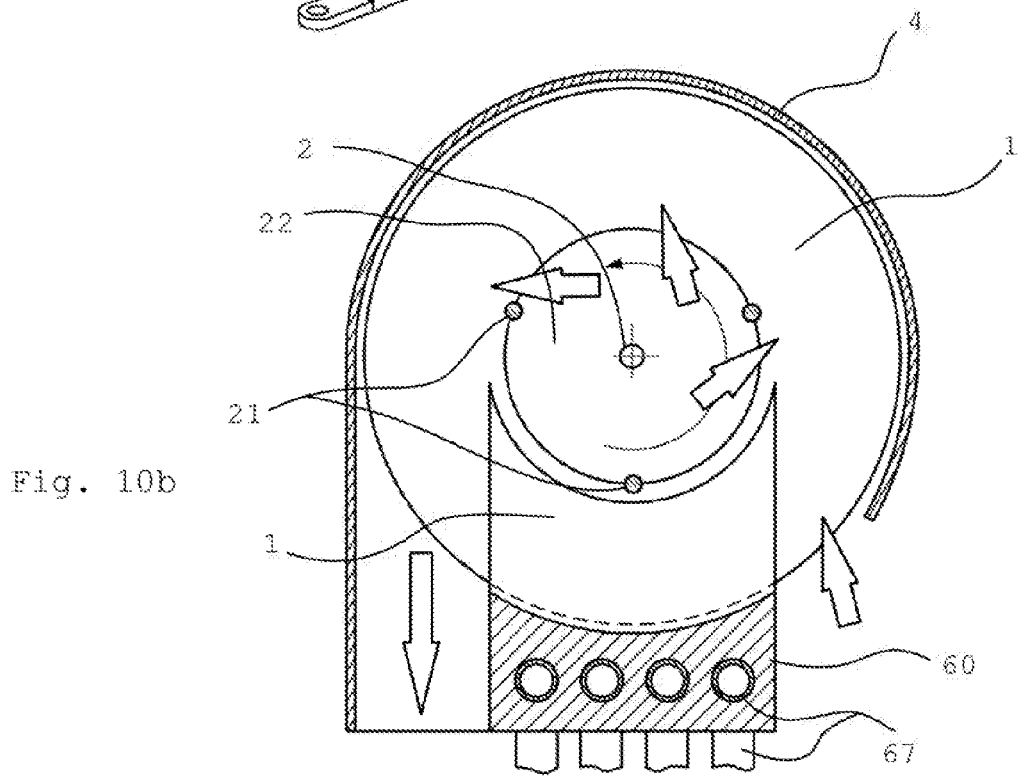
Fig. 10b

Fig. 11
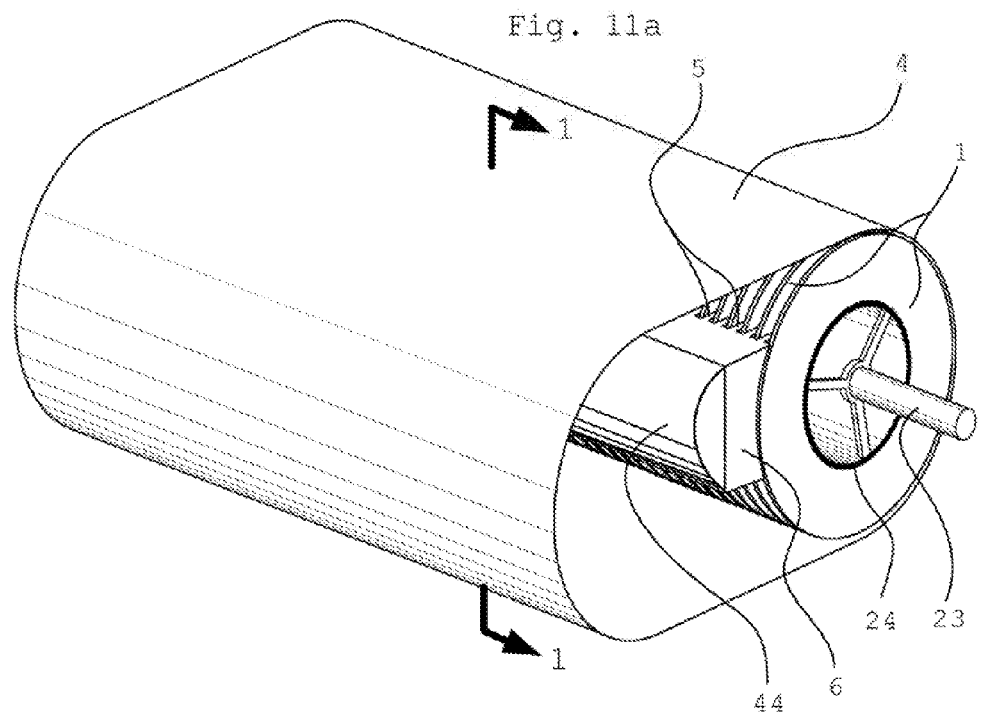
Fig. 11a
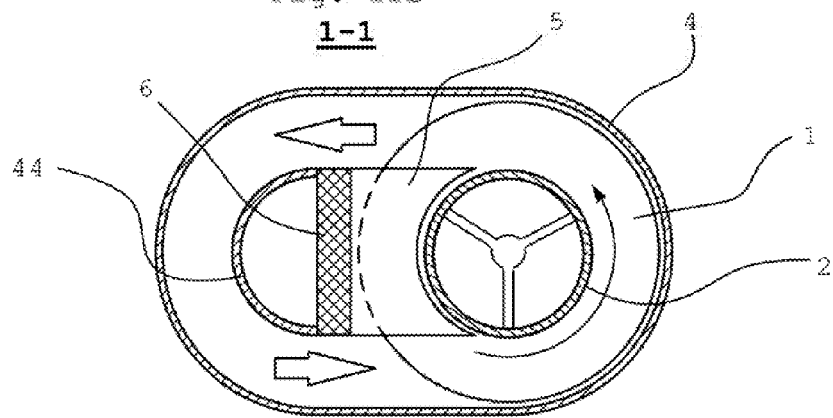
Fig. 11b
1-1

Fig. 12
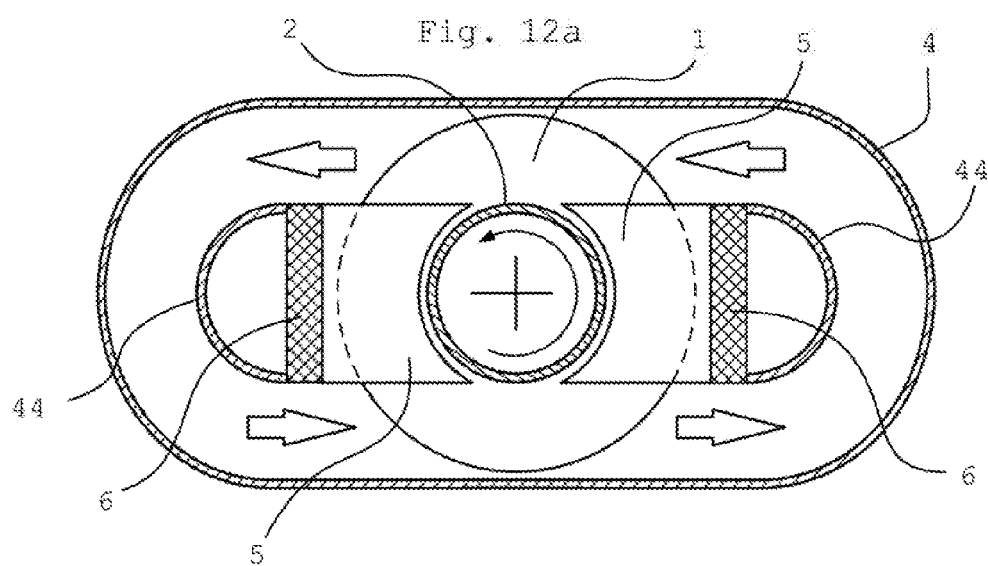
Fig. 12a
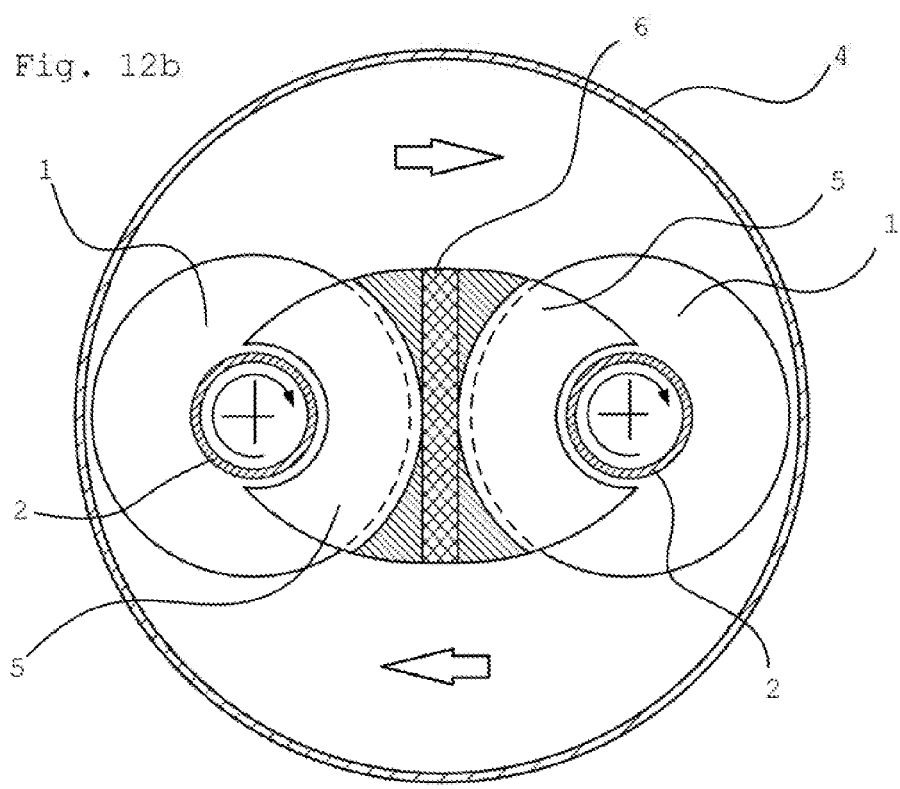
Fig. 12b

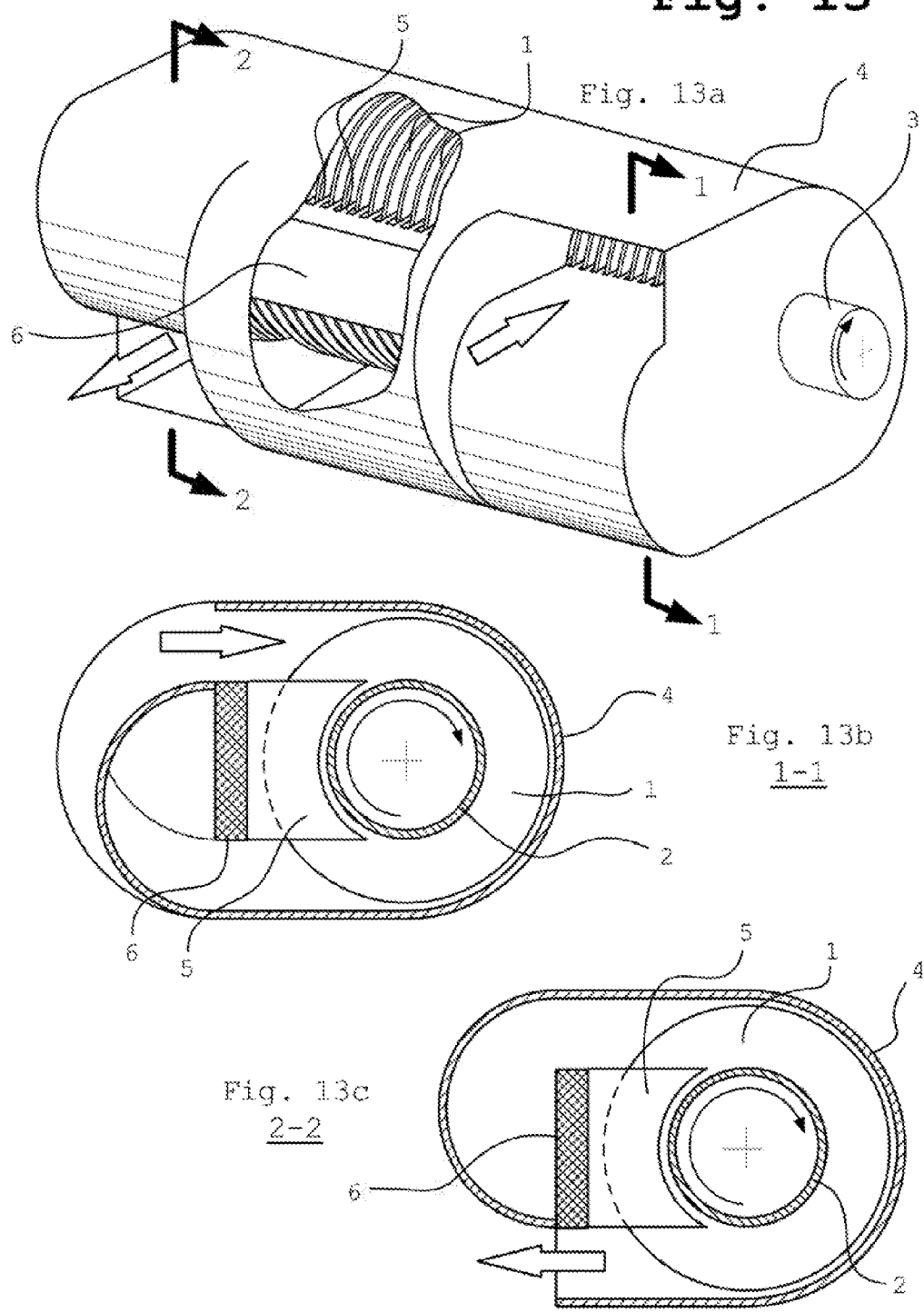

MULTI-DISK HEAT EXCHANGER AND FAN UNIT

FIELD OF THE INVENTION

This invention relates to the field of heat exchange devices, systems, and methods, and particularly to those devices, systems, and methods comprising rotating disks and/or multi-disk fans.

BACKGROUND OF THE INVENTION

The present invention addresses heat exchange devices and especially those employing at least one fluid as a heat carrier (e.g., air). In the case of residential air conditioners, the typical performance of the air cooled heat exchangers used for condensers and evaporators is at best marginal from the standpoint of achieving the maximum possible coefficient of performance (COP). The primary physical limitation to the performance of the current state of the art is the boundary layer of motionless air that adheres to and envelops all surfaces of the heat exchanger. Within this boundary layer region, diffusive transport is the dominant mechanism for heat transfer. The resulting thermal bottleneck largely determines the thermal resistance of the heat exchanger. The present invention addresses this issue and offers a practical solution to the boundary layer problem.

SUMMARY OF THE INVENTION

The subject of this disclosure is a heat exchanger combined with a fan and is designed for heat exchange between a thermal element and the fluid pumped through the heat exchanger. The fan comprises a plurality of disks fixedly mounted on a shaft which is driven to rotation (for example, by an electric motor). During rotation of the disks, the fan has a suction side and a discharge side. The revolving disks are coupled to a shaft with a gap between each disk. The disks are positioned partially overlapping in the space between heat transferring fins with which the thermal element is equipped. The thermal element, either in whole or some parts, has a temperature which is different from the temperature of the fluid pumped through device.

There are two basic methods in which heat exchange may be put into practice. The first of these methods supposes that the disks are the intermediate heat carrier between fins with which the thermal element is equipped and the fluid pumped through the disclosed heat exchanging device. The second method is when some portions of the pumped fluid are directed into the space between fins, where a heat exchange occurs between said fins and said portions of the fluid and then said portions of the fluid mix with fresh sucked-in fluid and together move towards a fan outlet. These two methods can each be applied in the disclosed device for heat exchange, either separately or simultaneously.

In some aspects, in order to increase the efficiency of the device and/or impart additional useful features, such as an ability to direct the fluid discharged from the heat exchange device, the device can be positioned at least partially (or entirely) within a housing. If the device is a fan of the tangential or radial-tangential type, the housing (or other elements involved in the formation of the suction side and the discharge side) is mandatory.

This design provides a basis for a wide range of heat exchanging methods, systems, and devices. For instance, when the goal is to heat or cool the fluid pumped through the heat exchanger, the housing may completely envelop the multi-disk rotor and the equipped by fins thermal element, forming a circulating chamber such that fluid discharged from a multi-disk fan is redirected to its suction side. The fluid coming into the heat exchanger is repeatedly captured by the multi-disk rotor and circulated inside the closed part of the housing. In this case, it is possible to achieve a greater difference in temperature between the ingoing and outgoing fluid passing through the heat exchanger. The pumping of fluid through the heat exchanger can be achieved and/or increased using various methods including but not limited to installation of an external fan, integrated with the heat exchanger fan, installation of the heat exchanger fan within an existing ventilation system, or installation of at least one helical baffle inside the housing which directs the circulating fluid in the heat exchanger in an additional and different direction (e.g., an axial direction). Baffles may further be used in combination to increase fluid discharge pressure and/or to increase axial directional flow of fluid through the device or through circulation chambers.

The present invention combines the heat exchanger and the fan into one unit. The method, systems, and devices disclosed herein can be applied, for example, to cool a fluid heated in a process of gas compression, or warming during operation of electric or electronic devices, ventilation devices, air conditioning devices, fluid heaters, fluid coolers, and dehumidification devices. The present invention is designed to provide a laminar (i.e. streamlined) flow of fluid discharged from the apparatus. Such laminar flow significantly reduces the level of noise generated which is under 18 decibels. The device may also have a compact size which is smaller than conventional same targeted devices have in 2-4 times.

BRIEF DESCRIPTION OF THE DRAWINGS

The drawings described herein are for illustrative purposes only and are of selected embodiments not including all possible implementations. The drawings are not intended to limit the scope of the present disclosure, and the figures may not show all elements of particular embodiments, even if operation would be possible without such elements.

The various cross sections shown and described are displayed in various manners, which help to distinguish one part of the invention from others. No illustration herein, however, is used to indicate the nature of the material from which these parts are made.

FIG. 1 illustrates one embodiment of the multi-disk heat exchanger and fan unit wherein the unit comprises a tangential type fan. FIG. 1a shows a perspective view of this embodiment. FIG. 1b is a cross-sectional view taken in a direction transverse to the axis of rotation of the disks of the same embodiment. FIG. 1c is a cross-sectional view taken in the direction passing through the axis of rotation of the disks 300 of the same embodiment.

FIG. 2a shows a perspective view of this embodiment. FIG. 2b is a cross-sectional view taken in the direction passing through the axis of rotation of the disks of the same embodiment.

FIG. 6a illustrates the general concept of a disk's geometry. FIGS. 6b-6f illustrate example embodiments of the disk element according to the present invention.

FIG. 7a shows a conventional shaft. FIG. 7b shows a shaft further comprising brackets and a hub. FIG. 7c shows a shaft further comprising a stationary axis and magnets. FIG. 7d shows two half-shafts coupled to a tubular shaft.

FIG. 8a shows a 90 degree shift of inlet versus outlet direction with one rotor. FIG. 8b shows a zero degree shift between inlet and outlet direction with one rotor. FIG. 8c shows a zero degree shift between inlet and outlet direction with two rotors. FIG. 8d shows another embodiment with a zero degree shift between inlet and outlet direction with two rotors, the inlet and outlet being offset (i.e. not linear).

FIG. 10 illustrates an example embodiment of the present invention, wherein the thermal element comprises a cold end of heat pipes, and having a radial-tangential (i.e. combined) type fan. FIG. 10a is a perspective view, and FIG. 10b is a top view of the same embodiment.

FIG. 11 illustrates an example embodiment of the present invention, which further comprises a cover forming a circulating chamber. FIG. 11a is a perspective view, and FIG. 11b is a cross-sectional view of the same embodiment.

FIG. 12 illustrates examples of embodiments of the present invention, which have two circulation chambers. FIG. 12a illustrates an example embodiment having two thermal elements and one multi-disk rotor. FIG. 12b illustrates an example embodiment having one thermal element and two multi-disk rotors.

FIG. 13 illustrates an example embodiment of the present invention comprising a circulation chamber and two integrated fans. FIG. 13a shows a perspective view of this embodiment. FIG. 13b shows a cross-sectional view of the first fan, and FIG. 13c shows a cross-sectional view of the second fan, of the same embodiment.

Figure 2:
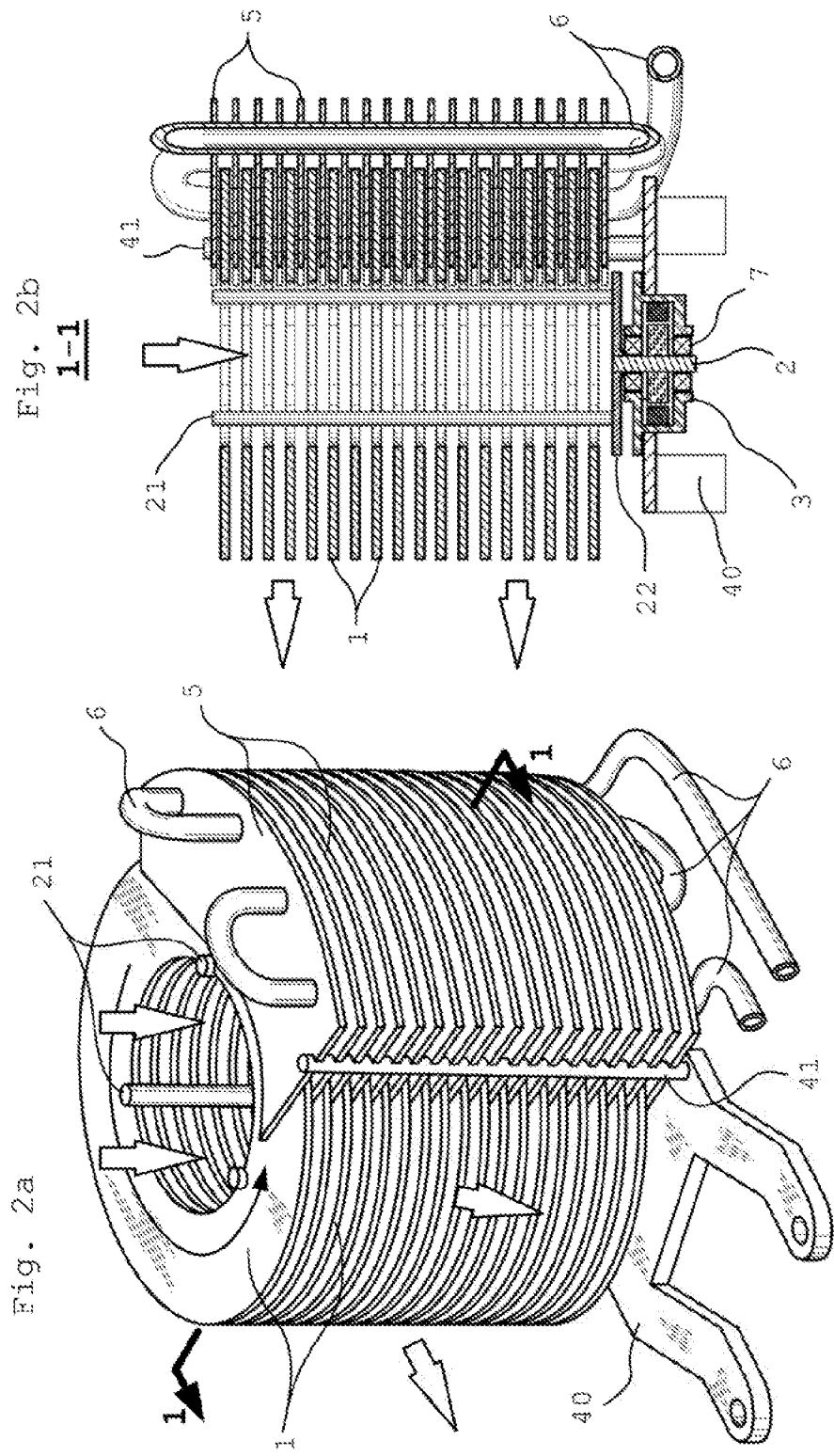
FIG. 2 illustrates one embodiment of the multi-disk heat exchanger and fan unit wherein the unit comprises a radial type fan.

The following reference numerals are used in the figures to depict particular elements of the present invention:

1—disk(s).
2—shaft; further potentially comprising one or more of the following elements: 20 (conventional shaft), 21 (bracket), 22 (hub), 23 (half-shaft), 24 (tubular shaft), and 25 (stationary axis).
3—rotational mover, motor, or rotor.
4—casing or housing; further potentially comprising the following elements: 40 (base), 41 (holder), 43 (shield), 44 (cowling), and 45 (helical or other type of baffle).
5—fin(s).
6—thermal element; further potentially comprising the following elements: 60 (finned baseplate), 61 (electrical heater), 62 (Peltier's element(s)), 63 (manifold), 64 (array of heater tubes), 65 (array of cooler tubes), 66 (mounting), 67 (heat pipe(s)), 68 (heat receiver comprising hot end(s) of heat pipe(s)), 690—(distributing manifold(s) with pipe/tube sleeve), 691—(collecting manifold(s) with pipe/tube sleeve).
7—bearing(s).
8—magnet(s) of rotor of electrical motor.
9—rotatable part of electric motor/rotor with tubular disks carrier.
10—cap(s) with pipe/tube adapter.
100—direction of fluid flow.
200—multi-disk rotor rotation direction.
300—axis of rotation of multi-disk rotor.
301—the location of the axis of rotation of the multi-disk rotor.
400—radius of the geometrical disk.
500—the length of the generating line of a geometrical disk.

DETAILED DESCRIPTION OF THE PREFERRED EMBODIMENT

Definitions

Figure 6:
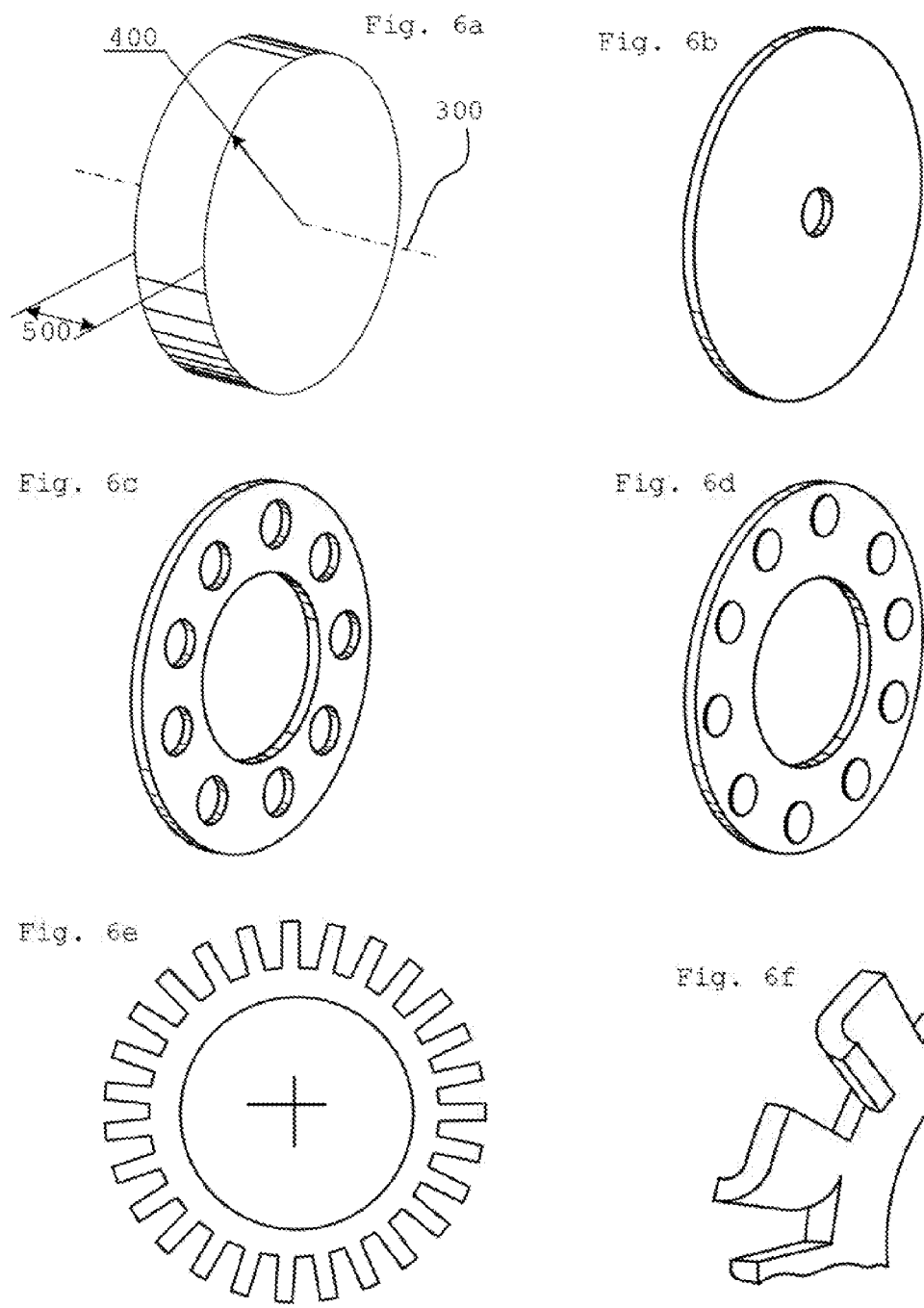
FIG. 6 shows varying example embodiments of the disks, having varying openings and/or protrusions. The disks may be combined in any amount and manner to form a plurality of disks which comprise the multi-disk rotor in the present invention.

It is important to adopt the following geometric definition of a disk for a clear understanding of the concept of the invention: a "disk", as used herein, is defined as a solid of rotation which may be formed by the rotation of a rectangle around an axis formed by one of the rectangle's shorter sides. Thus, the disk, as defined herein, is a geometrical circular cylinder which has a round end surface with a radius 400, which is larger than its height 500. FIG. 6a illustrates this geometric definition of a disk, as used throughout herein.

A "multi-disk rotor," as used herein, is defined as at least two spaced disks mounted on a shaft.

Example embodiments are presented herein to describe the present disclosure, the terminology used in the present disclosure is also further explained, and example embodiments are described in more detail with reference to the accompanying drawings.

Embodiments are provided such that this disclosure is thorough and conveys the scope of the invention to those who are skilled in the art. Numerous details such as examples of specific components, devices, and methods, are set forth to provide a thorough understanding of varying embodiments of the present disclosure. It will be apparent to those skilled in the art that specific details of the present invention need not be employed, embodiments may be constructed in many different forms, and no part of this description should be construed to limit the scope of the invention. In some example embodiments, well-known processes, device structures, and technologies are described generally and/or are not shown within the drawings included in the present disclosure.

Forced-air heat exchangers which have the traditional "heat-sink-plus-fan" or "fins-on-tube-plus-fan" device architecture encounter the fundamental limitations on performance of a device due to the effect of a "boundary layer." The "boundary layer" may be considered a stationary layer of "dead air" that clings to the surface of a structure (e.g. a finned heat sink or finned tubes), acting like a thermal insulator. Within such a boundary layer, molecular diffusion is typically the primary transport mechanism for conduction of heat, resulting in very poor heat transfer. In addition, a boundary layer creates significant resistance to air that is pumped through the space between the fins, resulting in a low rate of pumping. Therefore, both the average thermal gradient and the average specific heat flow on the heat transfer surface of traditional devices are lower than the devices, systems, and methods disclosed herein.

In general, the heat exchange takes place between the thermal element and pumped through heat exchanger fluid. A multi-disk rotor is a key element during heat exchanging process. On the one hand, the multi-disk rotor is designed to reduce the fundamental limitations of a boundary layer, as described above, by rotating between heat transferring fins with which thermal element is equipped. On the other hand, the multi-disk rotor also acts as a fan causing a flow of fluid through the device and the design of such a fan comprising a plurality of disks allows for a high volumetric pumping capacity that provides advanced transfer of heat to or from the fluid that is being pumped through the heat exchanger and fan unit.

There are two basic ways on which heat exchange put into practice. The first of them is when the heat exchange occurs in between said fins and said revolving disks. When part of a disk which is in space between fins, the temperature of this part of a disk changes. Rotating and leaving the space in between the fins, the disks capture new portions of fluid and transfer it from the suction side of the fan to the discharge side of the fan. The heat exchange occurs between fluid that is captured and transferred by the disks through the fan and the disks themselves. Temperature of the disks changes again. Thus the disks are used as intermediate heat carrier between fins and pumped fluid. The second way to put heat exchange in practice is when the disks have a shape which forces to move some portion of fluid through space between adjacent fins. Passing the space between adjacent fins, heat exchange occurs between fins and fluid. Leaving the space between adjacent fins said amount of fluid are mixed with sucked fresh fluid and pumped out from heat exchanger. These two ways can be applied in the disclosed device for heat exchange, either separately or simultaneously.

The disks of the multi-disk rotor rotating in the space between heat transferring fins increase the average temperature gradient on the surface of the fins, thereby increasing the heat flow. The main methods which may be used to further increase heat flow are: (1) reduction of the gap between the fins and the rotating disks, and (2) creation of a turbulent flow of the fluid in the gaps between the fins and the rotating disks, which reduces the thickness of the boundary layer and increases the heat flow on the surface of the fins and disks.

The present invention comprises devices, systems, and methods for heat exchange. The heat exchanging devices disclosed herein comprise at least one thermal element coupled to a plurality of heat transferring spaced fins, said fins extending into a first area, at least one multi-disk rotor, comprising a plurality of disks fixedly mounted to a shaft, wherein a portion of each disk inserts into a first area between said fins, said disks rotating around an axis of rotation freely between said fins, and a housing, said housing at least partially encasing said at least one rotor, fins, and at least one thermal element, said housing creating a first opening forming a fluid inlet and a second opening forming a fluid outlet, the combination of the rotor, housing, and openings forming a multi-disk fan, wherein a portion of said disks rotating inside said first area cause a heat exchange to occur between said fins and said rotating disks and/or a fluid moving through said first area, wherein a portion of said disks rotating outside said first area create a flow of fluid into said inlet and out of said outlet, wherein a heat exchange occurs between said rotating disks and said fluid flowing through the device and outside said first area.

In some aspects, said housing further comprises at least one cover, said cover forming at least one circulating chamber, said at least one circulating chamber directing a fluid exiting the outlet to the inlet.

In some aspects, the device further comprises one or more helical baffles positioned within each of said at least one circulating chamber, wherein said one or more helical baffles are positioned such that the baffle separates a fluid inlet from a fluid outlet, causing the fluid to gain additional movement in an axial direction.

In some aspects, the device further comprises one or more fluid fans integrated with said heat exchanging device.

In some aspects, the device further comprises an external fan.

Also disclosed is a heat exchanging device, comprising: a thermal element coupled to a plurality of heat transferring spaced fins, said fins extending into a first area, a plurality of disks, each disk having a central opening and being fixedly mounted to a fluid penetrable shaft, wherein a portion of each disk inserts into said first area between adjacent fins, said disks rotating around an axis of rotation freely between said adjacent fins, wherein a heat exchange occurs between said fins and said rotating disks, and wherein the rotation of said plurality of disks creates a flow of fluid into said device via said fluid penetrable shaft and out of said device via a periphery of said disks, said fluid exchanges heat with said disks as said fluid travels along said disks.

In some aspects, said thermal element comprises either a heat source, a heat absorber, or a combination thereof.

In some aspects, said fins and/or said disks are further provided with a surface feature, the surface feature comprising one or more of fins, vanes, blades, bends, channels, ducts, pins, posts, plates, slots, protrusions, recesses, perforations, holes, textured surfaces, segmented elements, staggered elements, and smooth surfaces.

In some aspects, said disks and/or said fins comprise aluminum.

In some aspects, said disks and/or said fins comprise copper.

In some aspects, said disks comprise an aluminum covering.

In some aspects, said disks comprise a copper covering.

In some aspects, said disks are mounted on a shaft via brackets.

In some aspects, the device comprises two or more multi-disk rotors.

In some aspects, at least two multi-disk rotors rotate in opposite directions.

In some aspects, the housing further comprises an extension to duct fluid away from said heat exchanging device.

Also disclosed are methods for increasing or decreasing the temperature of a fluid in a ventilation system, comprising installing the heat exchanging device as disclosed herein within said ventilation system.

In some aspects, the device further comprises at least a first and a second circulation chamber positioned in a series, each circulation chamber comprising one baffle, said baffles not overlapping in a projection plane, such that a fluid discharged from the first circulation chamber is directed to an inlet of the second circulation chamber, wherein a first discharge fluid pressure formed by the first circulation chamber is added to create a second discharge fluid pressure formed by the second circulation chamber.

In some aspects, the device is designed such that part of the fluid discharging from the device is redirected through a hollow tubular shaft of the multi-disk rotor to an inlet of the device, wherein a heat exchange occurs between said part of the fluid and said hollow tubular shaft, and wherein a size of the shaft changes as the heat exchange occurs.

Also disclosed is a system for heat exchange, comprising: a housing comprising an inlet and an outlet, one or more multi-disk rotors positioned within said housing, each said rotor comprising a plurality of disks fixedly mounted to a shaft, wherein a portion of each disk inserts into an area between adjacent fins of a thermal element, said disks rotating around an axis of rotation freely between said fins, wherein a heat exchange occurs between said fins and said rotating disks and/or portions of a fluid moving between said fins, and wherein said disks rotating outside a first area create a flow of fluid into said inlet and out of said outlet, wherein a heat exchange occurs between said rotating disks and fluid and/or leaving first area portions of fluid mix with pumped through device fluid and is directed to said outlet.

Structure and Operation of the Multi-Disk Fan and Heat Exchanger

Referring to FIG. 1, a multi-disk rotor constructed in accordance with a preferred embodiment of the invention includes a plurality of disks 1 fixedly mounted on a shaft 2 which is driven by a motor 3. The disks 1 are spaced axially along the shaft 2. "Fixedly," as used herein, means that the disks rotate with the shaft, and the axis of rotation of each disk, as defined below, coincides with the axis of rotation of the shaft. The motor 3 may be any device capable of directly or indirectly imparting rotational motion to the shaft 2. In the illustrated embodiment of FIG. 1, the motor 3 has a rotary output element directly coupled to the shaft 2.

The thermal element 6 is equipped with a plurality of spaced fins 5 which provide heat transfer from or to the thermal element 6.

FIG. 1a and FIG. 1b illustrate the relative position of element 6 of a device equipped with fins 5 and a multi-disk rotor, comprising a plurality of disks 1 mounted on the shaft 2. The disks 1 are situated in such a way that each disk is positioned partially between adjacent fins 5 so that the composite structure consists of alternating disks 1 and fins 5 while the plurality of disks 1 is able to rotate freely around a common axis.

The outer portion of the disks 1 of the multi-disk rotor, which are outside of the area comprising the fins 5 of a thermal element 6 are encased by a casing or housing. The housing also encases the shaft 2 and further connects to the thermal element 6 which is equipped with fins 5. An electrical motor 3 is mounted on the housing. In some embodiments, the housing further encases the thermal element 6 and fins 5.

Upon rotation of the multi-disk rotor in the direction of curved arrow 200, the disks 1 rotate to cause a portion of each disk 1 to exit the space between the fins 5 and, due to a boundary layer on the surface of the disk and the viscosity of the fluid, pull this fluid into the space between each disk, forming a suction area, and move the fluid further in the direction of rotation of the disks 1. The fluid located between the rotating disks is also influenced by forces that are pushing fluid out from the space between the disks. However, the housing that covers the rotating disks, and which is located sufficiently close to the peripheral parts of the disks, prevents the fluid from leaving the space between the disks, thus facilitating a directional movement of the fluid within the space between the disks.

At the areas where the distance between the housing and the multi-disk rotor increases (or where the housing is partially absent, or where the housing does not enclose the multi-disk rotor), and thus the fluid can enter or leave a space between disks, suction and discharge zones are formed. In addition to centrifugal forces which push out the fluid from the space between the disks, the ejection of fluid from the inter disk space is also facilitated by the presence of fins that displace fluid from the space between the disks.

The devices described above belong to the tangential type of disk pumps. Alternatively, in the case of radial type device, as exemplified in FIG. 2, the creation of a suction zone and a discharge zone is possible without a housing element (this is not to say, however, that a housing element cannot be used with a radial type device). FIG. 2 shows an embodiment of the present invention where the disks 1 have at least one opening in the central part and are attached to the shaft 2. The combination of multiple disks with openings forms an empty column so that the central part of each disk is open for access of the fluid through the column and into the inner disk space. When the multi-disk rotor is rotated, the fluid located between the disks also rotates under the influence of viscous forces and the forces associated with the boundary layer. The centrifugal forces arising due to rotation push the fluid out from the inner disk space. The discharged fluid is substituted with fresh fluid through the central part of the disks (i.e. through the formed empty column). Thus, the central part of the disk serves as the suction area while a peripheral part of the rotor serves as the discharge zone.

The disk pumps of the present invention exhibit high productivity in transferring large masses of fluid as well as a large surface area of disks that are involved in the transfer of the fluid. These two features provide high heat transfer capacity between the disks and the fluid that is pumped through the device.

The disks 1 partially rotate in the space between the fins 5, with which the thermal element 6 is equipped. The disks have a speed of rotation which is usually higher than 1500 rpm and passing through this space which stimulates the intense dissipation/inflow of the heat from/to the fins.

As mentioned above, there are two general methods for implementation of such intensification. The first method is to reduce the gap between the fins and the rotating disks. Reduction of the gap increases the temperature gradient and, hence, the thermal resistance between the fins and disks is decreased. Within this method, the disks are preferably made of (or coated with) materials with high thermal conductivity and heat capacity. Also within this method, the disks serve as an intermediate heat carrier between the fins and the fluid that is pumped through the device. This method may be used for heat exchangers where the thermal expansion of unit elements is relatively insignificant or compensated, and where the gap between the fins and the disks changes insignificantly during operation of the device—for example, in small-sized devices such as a cooler for a computer processor.

The second method is based on the phenomenon of increasing the heat exchange under conditions of turbulent air flow near the surface of the heat exchange. In this case, the present invention comprises disks that have a special shape and/or elements (e.g., additional openings, holes, or protrusions) which create turbulent air flows during the passage of the disks in the space between the fins. The heat exchange process involves the intermediate heat carriers (i.e. disks) and/or fluid heated/cooled in the gap, which, while coming out of the gap, is mixed with fresh air/fluid supplied to the input of the rotating disks and then discharged from the disks away from the fins.

Terminology

A heat exchanger is a specialized device that assists in the transfer of heat from one medium to another. One of the mediums involved in the heat exchange in the present disclosure is a fluid which is pumped through a heat exchanger by the multi-disk pump, which is an integral part of the heat exchanger. Although in the preferred embodiments the fluid is in a form of gas, the present disclosure does not have restrictions on the use of other types of fluids. Another medium for heat exchange is the thermal element. In the present disclosure, the thermal element is a rigid body, carrying a plurality of fins.

The thermal element is part of the disclosed device and can be a source or an absorber of the heat or their combination. As a rule, the thermal element is not autonomic and connected with external source or absorber of the thermal or another type of energy via energy carriers which are, for instance, electrical current, hot/heated or cool/cooled fluids, and etc. In the cases when said energy carrier is another than a heat carrier the energy transformer is applied to transform energy to thermal type of energy.

An example of the thermal element can be a tubular evaporator of an air conditioning system, which serves as a heat absorber or, for example, thermal bus bar, which collects heat released during operation of electronic microchips which in the present disclosure is the external source of the heat for the thermal element.

Figure 3:
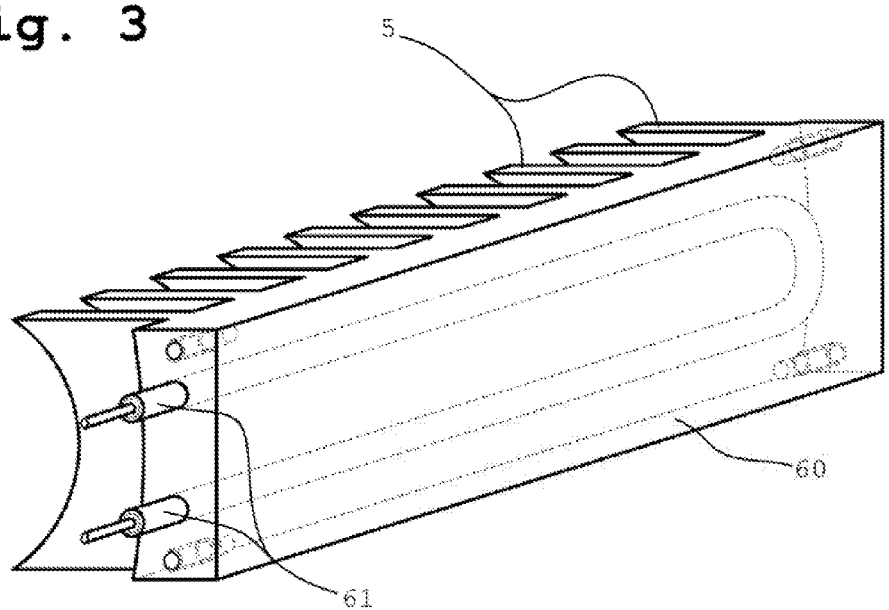
FIG. 3 shows an exemplary thermal element which is designed with for use with an electrical heater.

FIG. 3 shows the finned thermal element which contains the electrical heater 61 integrated with baseplate 60. In this case the thermal element is the source of the heat transforming electrical energy to heat.

Figure 4:
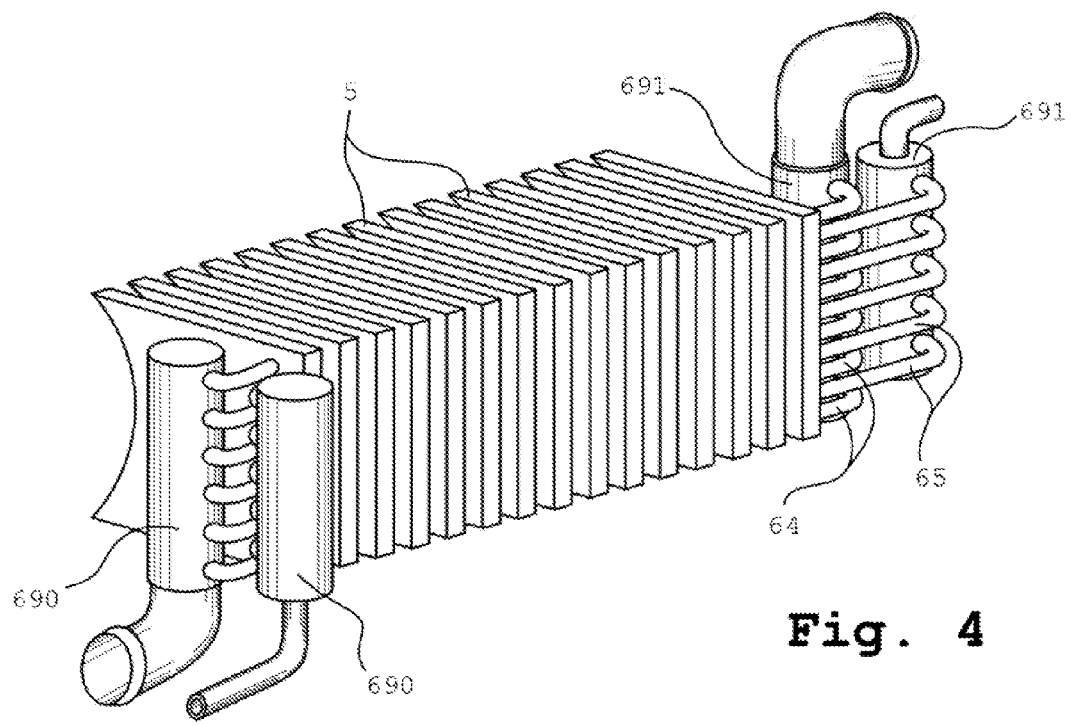
FIG. 4 shows an exemplary thermal element which is designed for a base of two arrays of tubes. The first array corresponds to the elements of a heater, and the second array corresponds to the elements of a cooler.

In some applications, such that, for instance, automotive air conditioning systems, the thermal element can contain simultaneously heater and cooler which can turn on alternately. FIG. 4 demonstrates a sample of that thermal element. Finned tubular thermal element consists of two undependable sets of the tubes, namely 64 and 65. The first of them 64 is aimed to provide fins by heat. The hot/heated fluid comes from externally into manifold-distributer 690, then fluid passes through tubes 64 and disposes of a containing heat to fins and then collects in second manifold 691 and leaves the thermal element.

Second tubular set 65 is aimed to take off a heat from fins and decrease its temperature. Cooling fluid goes through thermal element in the same manner as that for hot/heated fluid. The cool/cooled fluid comes from the external environment and into the manifold-distributer 690, then fluid passes through tubes 65 and absorbs heat from fins and then collects in second manifold 691 and leaves the thermal element.

Figure 5:
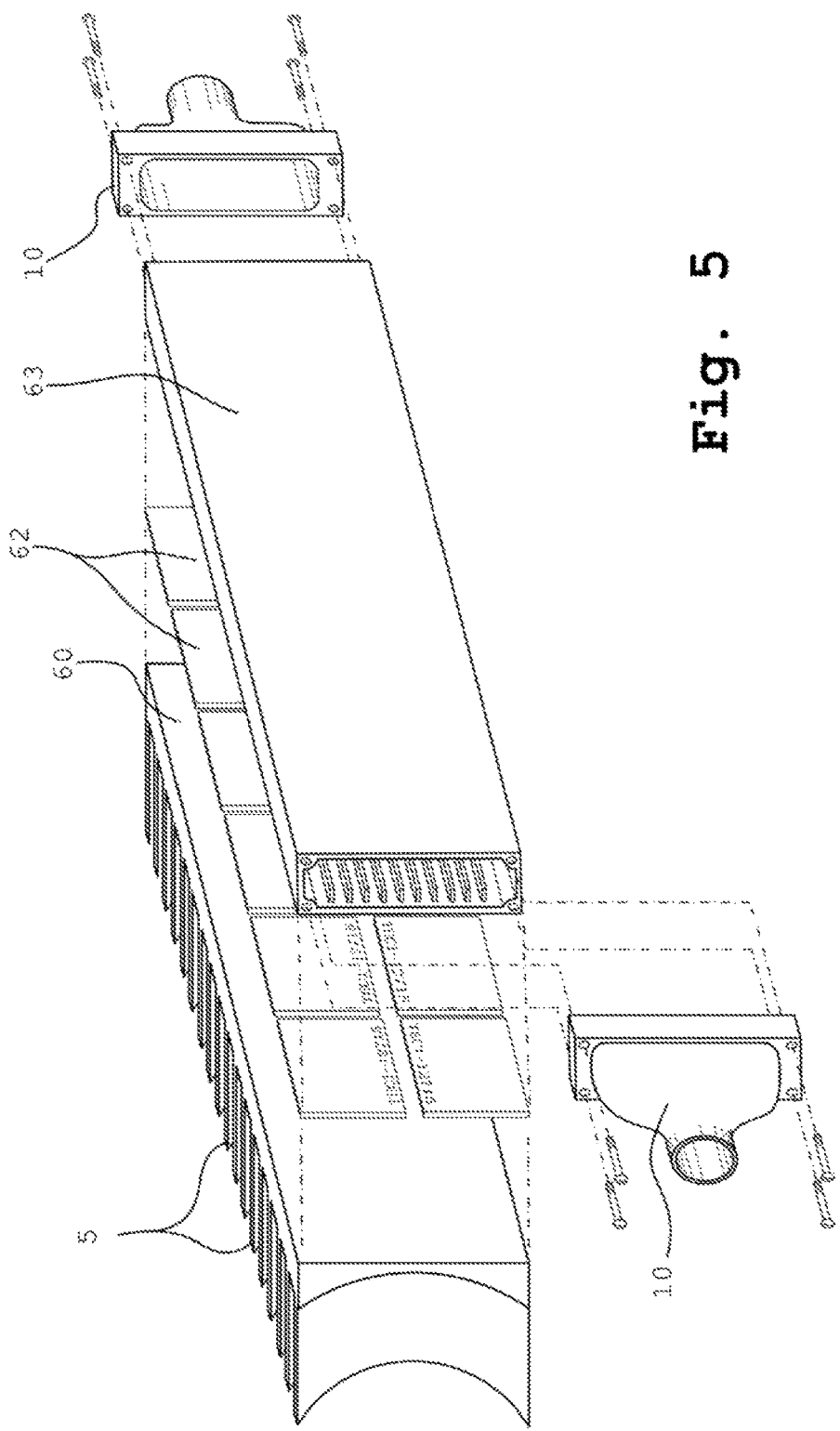
FIG. 5 shows an exemplary thermal element which comprises Peltier's elements.

FIG. 5 illustrates an example of a finned thermal element which uses as a source/absorber of heat at least one thermoelectric module—Peltier elements 62 which operate by the Peltier effect—when DC electricity flows through the device, it brings heat from one side to the other, so that one side gets cooler while the other gets hotter. The amount of thermal energy that is capable of generating this module on their surfaces depends of electrical current flowing through the module and supported by the temperature difference on the surfaces of the module. Turning direction of the current may both cooling and heating—it gives the possibility of using modules in the mode of "on-demand" in which the temperature control is possible at ambient temperatures both above and below the thermostat temperature.

This thermal element comprises the base plate 60, equipped on a first side with fins 5. On the second side of the base plate 60, a set of thermoelectric module(s) 62 is installed. This set of elements 62 is composed of at least one thermoelectric module Peltier element. On the opposite side of the thermoelectric module(s) 62, a manifold 63 is installed. This manifold 63 is exploited for heat exchange between the second side of the thermoelectric module(s) 62 and a fluidized heat carrier which flows through the manifold 63. In order to couple the manifold 63 to a source of fluidized heat carrier and its derivation from the manifold, the manifold 63 is equipped with pipe adapters 10.

The fins, with which a thermal element is equipped, assist in the transfer of the heat in one direction or the other, either from a heat source or to a heat absorber. The fins are preferably comprised of materials with high thermal conductivity, including but not limited to aluminum and copper. The disks of the present invention may similarly be comprised of such materials, or a coating thereof.

Another main element in the present disclosure is a plurality of disks. Generally, the geometric form of a disk according to the present invention comprises a round, nearly flat plate. It is important to adopt the given above geometric definition of a disk for a clear understanding of the concept of the invention. FIG. 6a illustrates this geometric definition of a disk.

In the present invention, the disk is a rotating element of the disclosed device, which, when it rotates, forms a rotation vector which can be circumscribed by a cylindrical surface of a geometric disk as defined above. In preferred embodiments, each disk of the plurality of disks of the present invention shares the same axis of rotation. In some embodiments, a plurality of disks may comprise different inner geometries (e.g., different patterns or sized openings and/or protrusions, cuts, etc.).

FIGS. 6b-6f show different example shapes of the disks. Such shapes may be repeated and/or combined, as discussed above.

Figure 7:
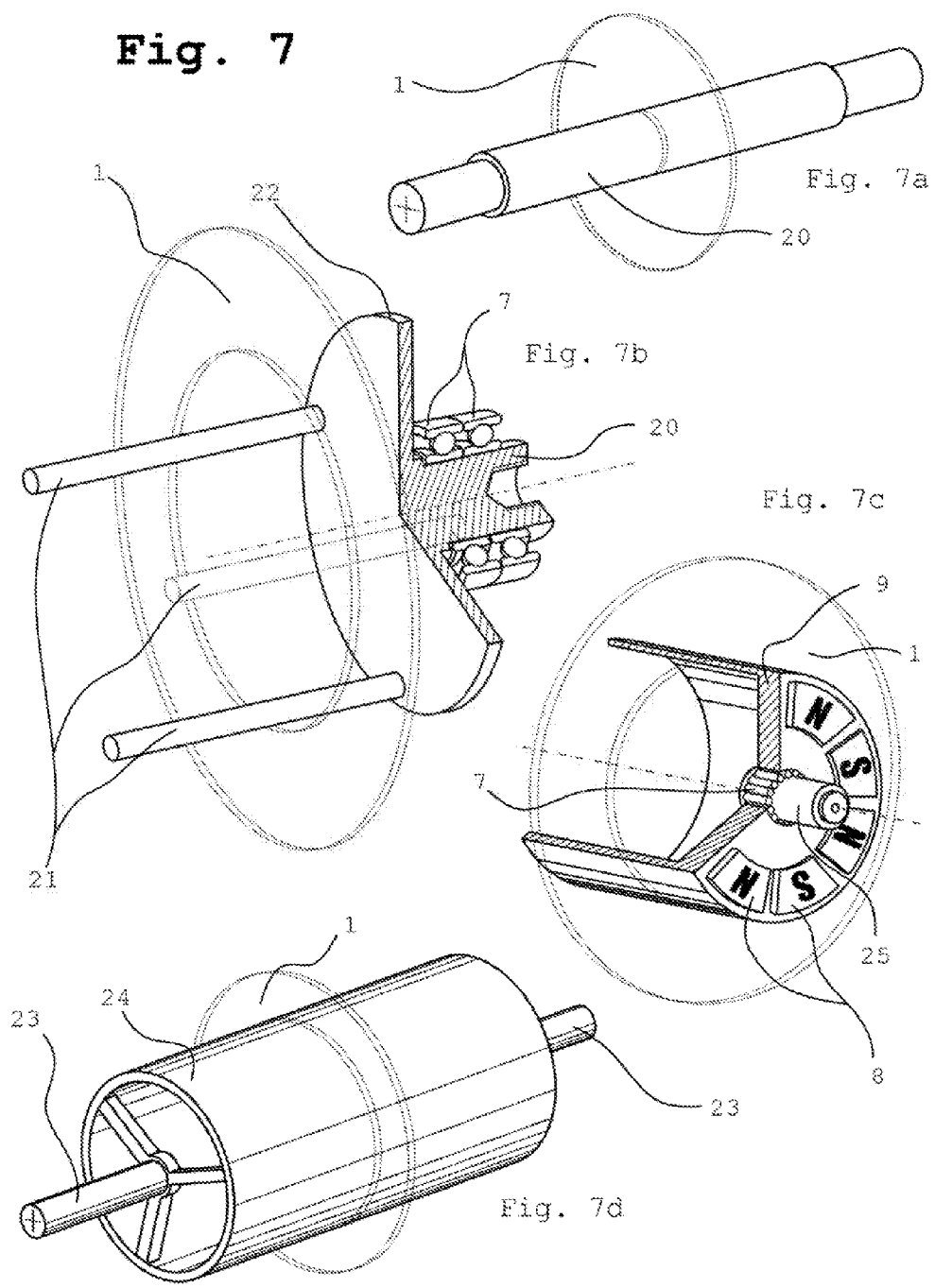
FIG. 7 shows examples of the shaft element according to the present invention.

In order to cause rotation of the disks, the disks are fixedly mounted on an element that is capable of rotational movement around an axis. The rotating disks move relative to other fixed elements such as the fins and the thermal element. For purposes of understanding the present disclosure, the element capable of rotational movement around an axis is referred to as the shaft, regardless of its design, form, method of mounting disks thereon, etc. The main requirements of the shaft are: (1) an ability to rotate under influence of a rotation mover, such as, e.g., an electric motor; (2) an ability to carry a plurality of disks; and (3) the axis of rotation of the shaft should coincide with the axis of rotation of the disks. FIG. 7 shows different exemplary manners of mounting disks on the shaft. In FIG. 7a, the disks 1 are mounted on a conventional shaft 20. In FIG. 7b, the disks 1 are mounted with brackets 21 to a hub 22, which is integrated with the shaft 20.

In FIG. 7c, the disks 1 are mounted to the tubular disk carrier of the rotating part 9 which is coupled to an immovable axel (i.e. stationary axis) 25 via one or more bearings 7. Here, the shaft is equipped with magnets 8 which cause rotation of a rotor 9 comprising a shaft-less electric motor.

In FIG. 4d, the disks 1 are mounted on a tubular shaft 24 coupled to two half-shafts 23.

Preferred Embodiments of the Invention

Figure 8:
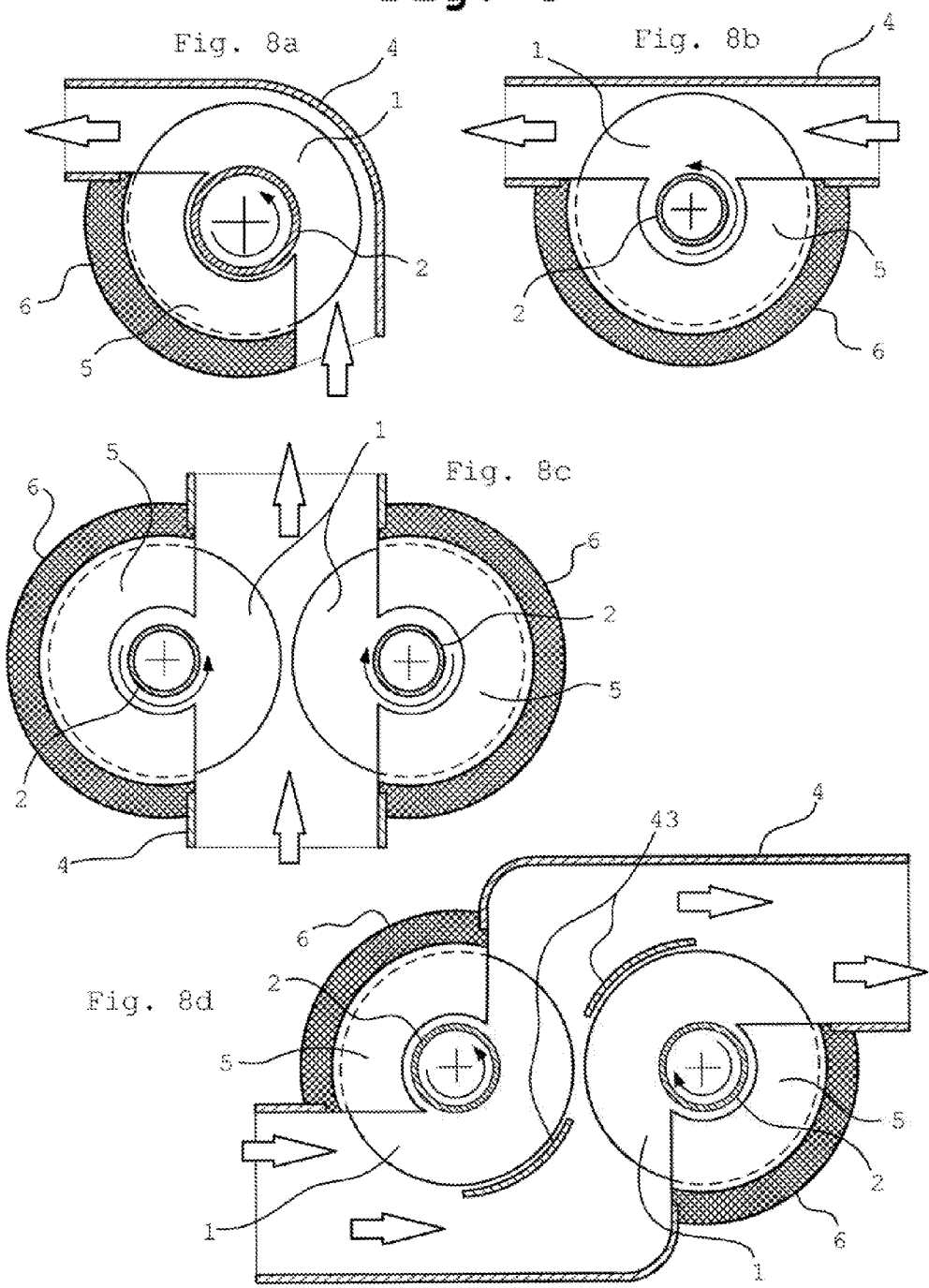
FIG. 8 shows a cross-sectional view of different embodiments having a tangential type fan.

The embodiment corresponding to FIG. 1, used for explanation of the structure and operation of the heat exchanger above, may have modifications, some examples of which are shown in FIG. 8.

In FIG. 1, the flow of the fluid that participates in the heat exchange, while passing through the device, changes its direction by 180 degrees. In a modified embodiment, as shown in FIG. 8a, the flow of the fluid passing through the device changes its direction by 90 degrees. In another modified embodiment, as shown in FIG. 8b, the flow of the fluid passing through the device does not change direction.

FIG. 8c illustrates an embodiment in which a tangential type device is formed by positioning two multi-disk rotors rotating in opposite directions and arranged in such a way that the axes of rotation of the two multi-disk rotors are parallel and the flow of fluid is linear. Furthermore, the distance between the edges of the disks of one multi-disk rotor and the edges of the disks of the second multi-disk rotor is such that the flows of fluid from each rotor interact to create a combined discharge. This interaction takes place in the zone of convergence of the multi-disk rotors. Moreover, the interaction is such that, within the zone of convergence, the flow of fluid moves co-directionally with the direction of rotation of the disks in this zone.

FIG. 8d illustrates an embodiment wherein a tangential type device is formed by using two rotors, in a manner similar to the embodiment shown in FIG. 8c but where the flow of fluid is parallel but offset between inlet and outlet. FIG. 8d illustrates one example of how the flow of fluid through a device can be manipulated via elements such as additional casing or housing 4 and shields 43 for directing a flow of fluid before and after interaction in a zone of convergence.

Figure 9:
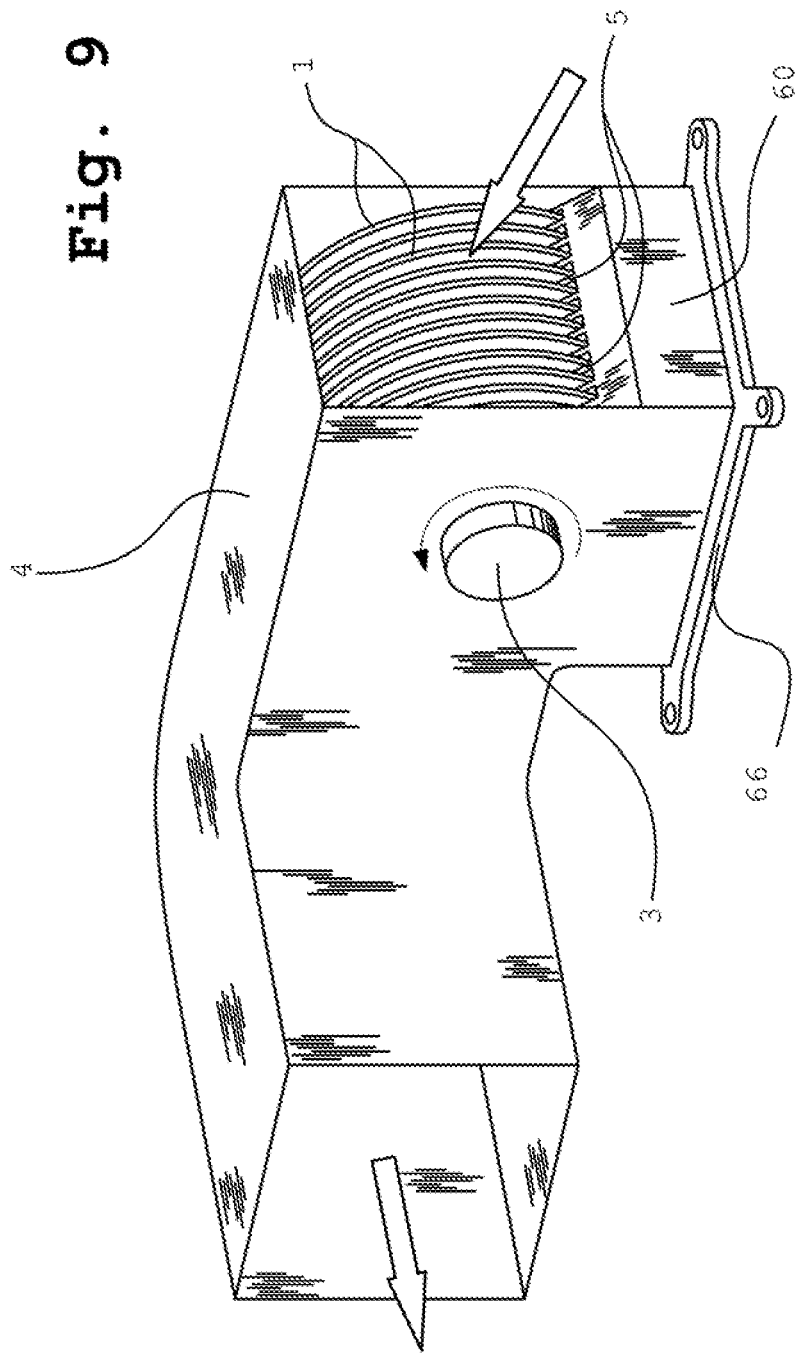
FIG. 9 illustrates an example embodiment of the present invention, which is designed to cool a computer's CPU.

FIG. 9 shows an example embodiment wherein the housing of the device has an extension to duct warmed air from the area where a heat source is located. In this embodiment, the thermal element comprises the base plate 60 and mounting 66 and must be attached to an external heat source.

FIG. 10 shows an example embodiment, wherein the cold ends of heat pipes 67 are integrated with finned baseplate and form together the thermal element 6, which are used to cool the fluid inside the heat pipes, and wherein a radial-tangential type fan combined with a housing discharges the heated air in certain directions. The primary heat source (not shown) is external and must be coupled with a heat receiver comprising the hot ends of heat pipes 68.

The above-mentioned features may be employed in varying combinations in order to pump large volumes of fluid, and even with a low temperature differential between the temperature of the incoming and outgoing fluid, the present invention ensures the transfer of large amounts of thermal energy. The features may also be installed in an existing fluid circulation system in order to increase the depth of a cooling or heating of pumped through heat exchanger fluid. Additionally, there are numerous applications, for example in HVAC and refrigeration systems, which do not require the transfer of large amounts of fluid, and instead require a more significant temperature difference between incoming and outgoing flows of a fluid. One way to accomplish this effect, using the same devices as described herein, is to reduce the speed of rotation of the multi-disk rotor of the heat exchanger. Practical utilization of this solution, however, at least for cooling an indoor space containing dust and damp air, has shown that the reduction of speed can lead to settling of dust and frost on the disks, thus reducing the efficiency of heat exchange.

Another way to change the temperature differential of the fluid at a greater scale is to employ a fluid circulation inside the heat exchanger. FIG. 11 shows an example embodiment, wherein the cover/housing 4 completely encases the thermal element 6 equipped with fins 5 as well as the multi-disk rotor. One portion of this cover 4, similar to that in the embodiment shown in FIG. 1, serves as an element of the tangential fan (right side of FIG. 11b). Another part of the cover 4 forms a circulation chamber (left side of FIG. 11b), where the discharged fluid passing in the space between the cover 4 and the thermal element 6 is directed to the suction zone of the heat exchanger fan. In FIG. 11, the cowling 44 serves to reduce aerodynamic losses in the circulating flow of the fluid through the circulation chamber. Due to the repeated passage of the fluid through the fan element, the temperature of the fluid changes rapidly.

Figure 14:
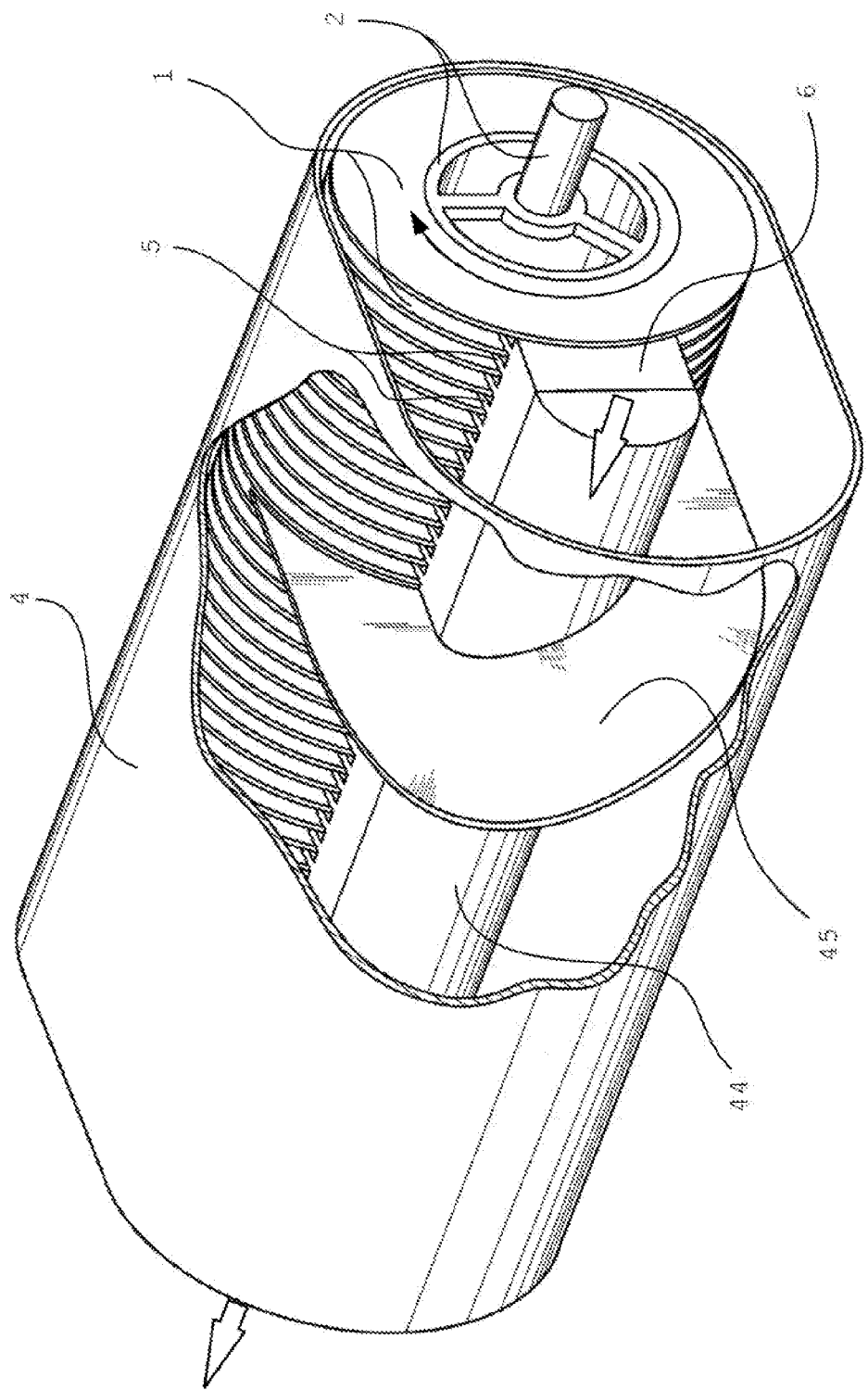
FIG. 14 illustrates an example embodiment of the present invention comprising a helical baffle.

The embodiment described and illustrated in FIG. 11 requires an additional fan (or installation within an existing ventilation system), which pumps fluid through the heat exchanger in a direction perpendicular to the circulated flow of fluid existing in the circulation chamber. Thus, the fluid movement caused by the fan (or existing system) interacts with the fluid in the circulating chamber as it passes through. The additional fan may be external, and/or the heat exchanger may be installed in-line within a ventilation system. Alternatively, the additional fan may be integrated with the heat exchanger fan. Examples of that fan are shown in FIG. 13 and FIG. 14 and will be described further.

FIGS. 12a and 12b show further example embodiments of the heat exchanger with a circulation chamber enclosed by a cover.

FIG. 12a illustrates an example embodiment comprising a single multi-disk rotor, two thermal elements each equipped with fins, and two circulation chambers.

FIG. 12b shows an example embodiment comprising a single thermal element equipped with fins, two multi-disk rotors, and two circulation chambers.

As mentioned above, the heat exchanger with one or more circulation chambers may be equipped with an additional fan integrated with the heat exchanger. Other methods for pumping the fluid through the heat exchanger may be used as well.

FIG. 13 shows the exemplary heat exchanger with circulation chamber and integrated with the heat exchanger multi-disk fans. The heat exchanger comprises three sections. Central section is the heat exchanger with the circulation chamber. Another sections are fans which take a part in the heat exchanging as well. First fan, positioned on right side on FIG. 13a and its cross-sectional view 1-1 is shown on FIG. 13b, is the fan of suction type. During operation this fan sucks a fresh fluid and discharges it into the circulation chamber. Inversely, the second fan which is positioned on left side of the embodiment on FIG. 13a, sucks fluid from a circulation chamber and discharges it out from the heat exchanger. Its cross-sectional view 2-2 is shown on FIG. 13c. All of the sections are designed to use common thermal element and common multi-disk rotor. Presence of both fans is not mandatory.

FIG. 14 illustrates an example embodiment wherein a circulating chamber of the device further comprises at least one helical baffle. The baffle is installed in the circulation chamber in such a way that the fluid discharged to the circulation chamber from the fan formed by the multi-disk rotor is influenced by the helical baffle. Thus, in addition to the circular motion caused by the cover, the fluid acquires a movement in an axial direction. The part of a described embodiment which comprises said baffle and the corresponding to this baffle part of a multi-disk rotor, the part of finned thermal element and the part of a housing composes "axial pumping section" or "section with helical baffle" of said embodiment. The presence of each additional non-overlapping axial pumping section causes a further increase of the discharge pressure in the heat exchangers fluid outlet zone. An increase in the discharge pressure admits to use a described embodiment as an example for ducted HVAC systems. With that the described embodiment does not need in any additional fan to supply the fluid flow through itself and thus provides compactness of heat exchanger in general.

Figure 15:
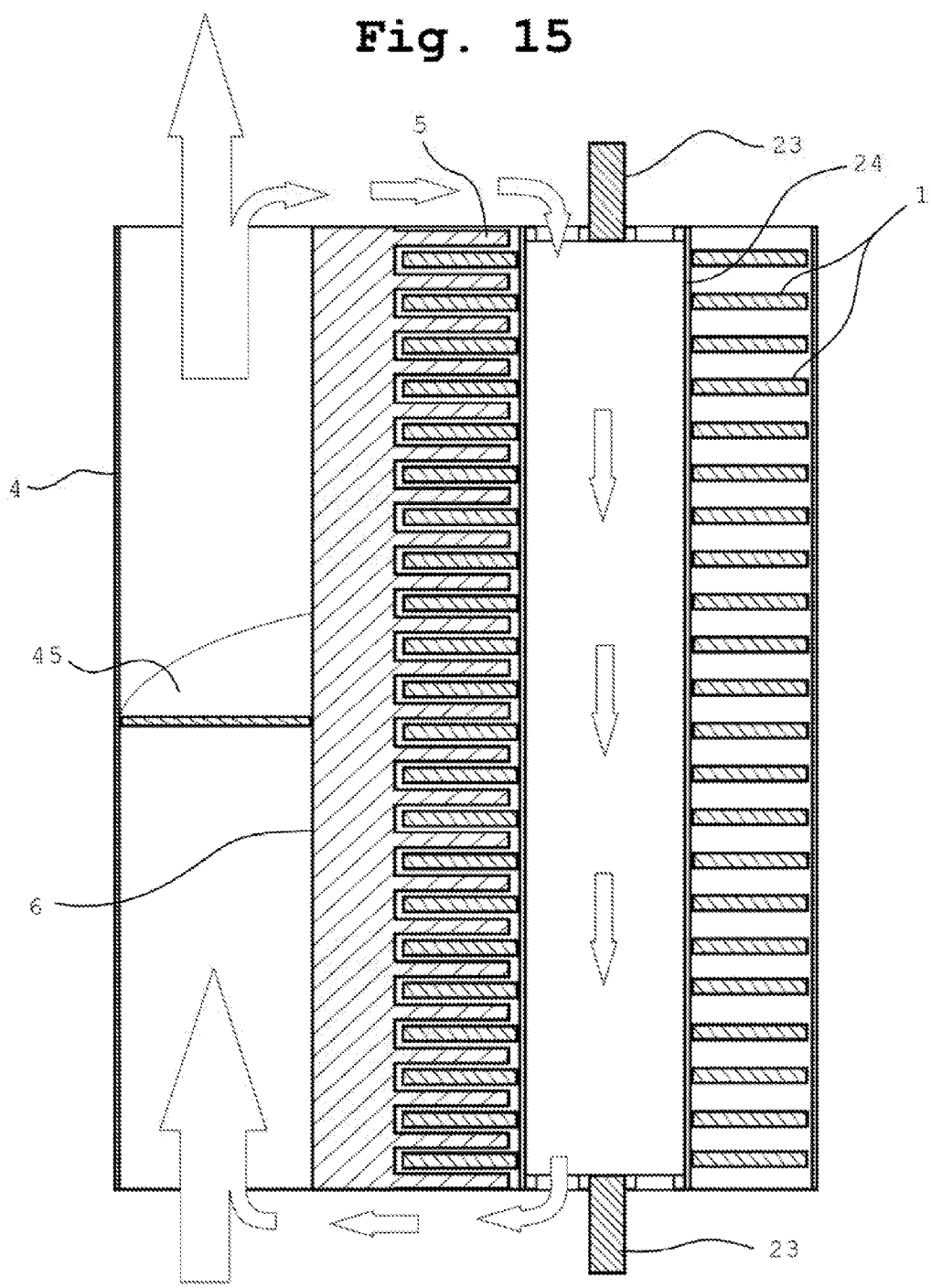
FIG. 15 shows a cross-sectional view (through the axis of rotation of the rotor) of the embodiment shown in FIG. 14.

When operating the different elements of disclosed in present invention heat exchanger have different temperatures. Usually in HVAC applications the range of that temperature difference is not more 100-120 Celsius degrees, however for devices with thermal capacity higher than 40000 BTU the certain steps have to be undertaken to compensate unequal thermal expansion of heat exchanger elements. There are numerous of methods to do that which is knew to practitioners skilled in art. FIG. 15 shows the preferable method of the compensation of the unequal thermal expansion of the thermal element 6 and the tubular part 24 of a shaft of the multi-disk rotor. On the cross-sectional view of FIG. 15, the directions of fluid flows are shown by arrows. As shown, the part of the discharged fluid which, as a rule, is not more 5% of full discharging fluid flow is taken to direct it into the tubular shaft 24. When the fluid passes through the hollow shaft, the heat exchange occurs between the fluid and the shaft. The temperature of a shaft and its length change and thus the compensation takes place. The fluid discharging from the tubular shaft is directed to the inlet of a heat exchanger.

The description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

Moreover, the words "example" or "exemplary" are used herein to mean serving as an example, instance, or illustration. Any aspect or design described herein as "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

What is claimed is:

1. A heat exchanging device, comprising:
   at least one thermal element coupled to a plurality of heat transferring spaced fins, said fins extending into a first area,
   at least one multi-disk rotor, comprising a plurality of disks fixedly mounted to a shaft, wherein a portion of each disk inserts into said first area and between said fins, said disks rotating around an axis of rotation freely between said fins, and
   a housing, said housing at least partially encasing said at least one rotor, fins, and at least one thermal element, said housing creating a first opening forming a fluid inlet and a second opening forming a fluid outlet, the combination of the rotor, housing, and openings forming a multi-disk fan,
   wherein a portion of said disks rotating inside said first area cause a heat exchange to occur between said fins and said rotating disks and/or a fluid moving through said first area,
   wherein a portion of said disks rotating outside said first area create a flow of fluid into said inlet and out of said outlet, wherein a heat exchange occurs between said rotating disks and said fluid flowing through the device and outside said first area; and
   one or more helical baffles positioned within each of an at least one circulating chamber formed by the housing, wherein said one or more helical baffles are positioned such that the baffle separates a fluid inlet from a fluid outlet, causing the fluid to gain additional movement in an axial direction.

2. The device of claim 1, wherein said housing further comprises at least one cover, said cover forming the at least one circulating chamber, said at least one circulating chamber directing a fluid exiting the outlet to the inlet.

3. The device of claim 2, further comprising one or more fluid fans integrated with said heat exchanging device.

4. The device of claim 2, further comprising an external fan.

5. The device of claim 1, wherein said thermal element comprises a heat source and a heat absorber.

6. The device of claim 1, wherein said fins and/or said disks are further provided with a surface feature, the surface feature comprising one or more of fins, vanes, blades, bends, channels, ducts, pins, posts, plates, slots, protrusions, recesses, perforations, holes, textured surfaces, segmented elements, staggered elements, and smooth surfaces.

7. The device of claim 1, wherein said disks and/or said fins comprise aluminum.

8. The device of claim 1, wherein said disks and/or said fins comprise copper.

9. The device of claim 1, wherein said disks comprise an aluminum covering.

10. The device of claim 1, wherein said disks comprise a copper covering.

11. The device of claim 1, wherein said disks are mounted on a shaft via brackets.

12. The device of claim 1, comprising two or more multi-disk rotors.

13. The device of claim 2, wherein at least two multi-disk rotors rotate in opposite directions.

14. The device of claim 1, wherein the housing further comprises an extension to duct fluid away from said heat exchanging device.

15. A method for increasing or decreasing the temperature of a fluid in a ventilation system, comprising installing the device of claim 2 within said ventilation system.

16. The device of claim 1, comprising at least a first and a second circulation chamber positioned in a series, each circulation chamber comprising one baffle, said baffles not overlapping in a projection plane, such that a fluid discharged from the first circulation chamber is directed to an inlet of the second circulation chamber, wherein a first discharge fluid pressure formed by the first circulation chamber is added to create a second discharge fluid pressure formed by the second circulation chamber.

17. The device of claim 1, wherein part of the fluid discharging from the device is redirected through a hollow tubular shaft of the multi-disk rotor to an inlet of the device, wherein a heat exchange occurs between said part of the fluid and said hollow tubular shaft, and wherein a size of the shaft changes as the heat exchange occurs.

* * * * *